(12) United States Patent
Tanahashi

(10) Patent No.: US 9,370,100 B2
(45) Date of Patent: Jun. 14, 2016

(54) LIGHT EMITTING MODULE

(71) Applicant: Panasonic Corporation, Osaka (JP)

(72) Inventor: Osamu Tanahashi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 169 days.

(21) Appl. No.: 14/456,443

(22) Filed: Aug. 11, 2014

(65) Prior Publication Data

US 2015/0069905 A1  Mar. 12, 2015

(30) Foreign Application Priority Data

Sep. 11, 2013  (JP) ................................. 2013-188745

(51) Int. Cl.
*H01L 51/52* (2006.01)
*H05B 33/02* (2006.01)
*H05K 1/14* (2006.01)

(52) U.S. Cl.
CPC .............. *H05K 1/14* (2013.01); *H01L 51/5203* (2013.01); *H01L 2251/5361* (2013.01); *H05K 2201/10128* (2013.01); *H05K 2201/10287* (2013.01)

(58) Field of Classification Search
CPC .................. H01L 27/3297; H05K 2201/10128; H05K 2201/10106; H05K 3/36–3/368; H05K 1/14–1/148; H05K 1/11–1/119; H05B 33/0896; H05B 33/06
See application file for complete search history.

(56) References Cited

U.S. PATENT DOCUMENTS

| | | | | |
|---|---|---|---|---|
| 6,693,384 B1 * | 2/2004 | Vicentini | ................ | H01L 24/24 257/668 |
| 9,095,080 B2 * | 7/2015 | Yoon | ................... | H05K 7/20963 |
| 2008/0042549 A1 | 2/2008 | Song et al. | | |
| 2008/0198593 A1 | 8/2008 | Breinich et al. | | |
| 2009/0160321 A1 | 6/2009 | Verjans | | |
| 2009/0302731 A1 * | 12/2009 | Takamura | ........... | H01L 27/3276 313/46 |
| 2012/0256896 A1 * | 10/2012 | Yamazaki | ........... | H01L 27/3267 345/211 |
| 2013/0093308 A1 * | 4/2013 | Kagotani | ............ | H01L 51/5203 313/45 |
| 2013/0134866 A1 * | 5/2013 | Kawachi | ................ | H05B 33/06 313/498 |
| 2014/0203703 A1 * | 7/2014 | Maatta | ................... | H05B 33/02 313/504 |
| 2014/0239317 A1 * | 8/2014 | Bang | ...................... | H05K 1/147 257/88 |

FOREIGN PATENT DOCUMENTS

| | | |
|---|---|---|
| JP | 2007-324063 | 12/2007 |
| JP | 2008-226598 | 9/2008 |
| JP | 2011-222449 | 11/2011 |
| JP | 2011-249144 | 12/2011 |
| JP | 2013-102001 | 5/2013 |

* cited by examiner

*Primary Examiner* — Mariceli Santiago

(74) *Attorney, Agent, or Firm* — Renner, Otto, Boisselle & Sklar, LLP

(57) ABSTRACT

Auxiliary wiring boards 5a and 5b have electrode pads 51a and 51b which are electrically connected to electrode extraction units 26a and 26b of an organic EL device 21 and metal pads 52a and 52b which are electrically connected to the electrode pads 51a and 51b. The metal pads 52a and 52b are wire-bonded to metal lands 31a and 31b of a wiring board 3 by ultrasonic waves at a low joining temperature. Accordingly, a thermal denaturation of the organic EL device 21 can be suppressed and moreover, the organic EL device 21 can be electrically connected to the wiring board 3 regardless of whether the electrode extraction units 26a and 26b are made up of the metal material or the non-metal material.

12 Claims, 6 Drawing Sheets

LIGHT EMITTING MODULE

FIELD OF THE INVENTION

The present invention relates to a light emitting module in which an organic EL device is used as a light source.

BACKGROUND

An organic EL device is a planar luminescent material which can emit light of high intensity at a low voltage and can provide various emission colors depending on a type of organic compound contained therein, and in recent years, has attracted attention as a light source of a light emitting module.

The organic EL device generally has a transparent electrode (anode) made up of ITO, an organic emitting layer laminated on the anode, and a cathode laminated on the organic emitting layer. Part of the anode and part of the cathode are derived outside of the organic emitting layer to form electrode extraction units, and these electrode extraction units are electrically connected to a wiring board which supplies power to the organic EL device. This electrical connection is achieved, for example, by providing a soldering metal multilayer film (metal pad) on the electrode extraction units and connecting the metal pad to a metal land of the wiring board by a conductive metal wire (refer to Japanese Unexamined Patent Application Publication No. 2007-324063, for example). The metal wire is soldered to the metal pad and the metal land.

There is also a known light-emitting device in which the metal wire is joined to the metal pad by ultrasonic wire bonding instead of soldering metal wire connection (refer to Japanese Unexamined Patent Application Publication No. 2011-222449, for example).

SUMMARY

Problems to be Solved by the Invention

However, since the soldering metal wire connection is performed at a high temperature of approximately 300 degrees Celsius, there is a possibility that the organic EL device is thermally denatured by heat generated in a soldering process on the organic EL device described in JP 2007-324063. Moreover, the ultrasonic wire bonding as described in JP 2011-222449 can be used for a metal material such as the metal pad but not for a non-metal material such as ITO.

The present invention has been made to solve the above problems, and an object of the present invention is to provide a light emitting module which can suppress thermal denaturation of an organic EL device and further enables an electrical connection of the organic EL device to a wiring board regardless of whether an electrode extraction unit is made up of a metal material or a non-metal material.

Solution to the Problems

One aspect of the present invention relates to a light emitting module including a flat plate-shaped light emitting panel having a light emitting surface on one surface; and a wiring board which is mounted on a non-light emitting surface located to an opposite side of the light emitting surface of the light emitting panel to supply power to the light emitting panel, wherein the light emitting module further includes an auxiliary wiring board which electrically connects the light emitting panel to the wiring board, the light emitting panel has an organic EL device as a light source, and electrode extraction units provided on the non-light emitting surface and derived from electrodes of the organic EL device, the wiring board has a conductive metal land provided on a surface located opposite to a surface which is mounted on the light emitting panel, the auxiliary wiring board has an electrode pad provided on a surface facing the light emitting panel and electrically connected to the electrode extraction units and a conductive metal pad provided on a surface located to an opposite side of the surface on which the electrode pad is located and electrically connected to the electrode pad, and the metal pad is wire-bonded to the metal land by using a conductive metal wire, and both ends of the metal wire are joined to the metal pad and the metal land by ultrasonic joining.

According to one aspect of the invention, the metal pad is located to a periphery of the light emitting module, ends of the metal wire joined to the metal pad is arranged so as to extend in one direction along a side of the light emitting panel, and ends of the metal wire joined to the metal land is arranged so as to extend in a direction different from that of the ends of the metal wire joined to the metal pad.

According to one aspect of the invention, the metal pad and the metal land are arranged with a position gap each other when the light emitting module is viewed from the wiring board side.

According to one aspect of the invention, the electrode pad is electrically connected to the electrode extraction units by a conductive adhesive material.

According to one aspect of the invention, the adhesive material is made up of an anisotropic conductive adhesive.

According to one aspect of the invention, the height of the metal pad is different from that of the metal land when the light emitting module is viewed from the side, and the metal wire has a liberated part which is liberated from the metal pad.

According to one aspect of the invention, the metal wire has a flexure part which bends to protrude toward the side of the light emitting module between both ends joined to the metal pad and the metal land.

According to one aspect of the invention, the end of the metal wire joined to the metal pad is arranged close to the side of the light emitting module on the metal pad.

According to one aspect of the invention, the end of the metal wire joined to the metal pad is sealed by a sealing resin injected into an inner side of the light emitting module relative to the end.

According to one aspect of the invention, the metal wire is made up of an aluminum wire.

According to one aspect of the invention, gold coating is applied on a surface of the metal pad.

According to one aspect of the invention, the wiring board is adhered to the light emitting panel just below the metal land.

Effects of the Invention

According to the present invention, the metal pad of the auxiliary wiring board, which is electrically connected to the electrode extraction unit of the organic EL device, is wire-bonded to the metal land of the wiring board by ultrasonic waves at low joining temperature. Thus, thermal denaturation of the organic EL device can be suppressed and moreover, the organic EL device can be electrically connected to the wiring board regardless of whether the electrode extraction unit is made up of the metal material or the non-metal material.

DETAILED DESCRIPTION

Figure 1:
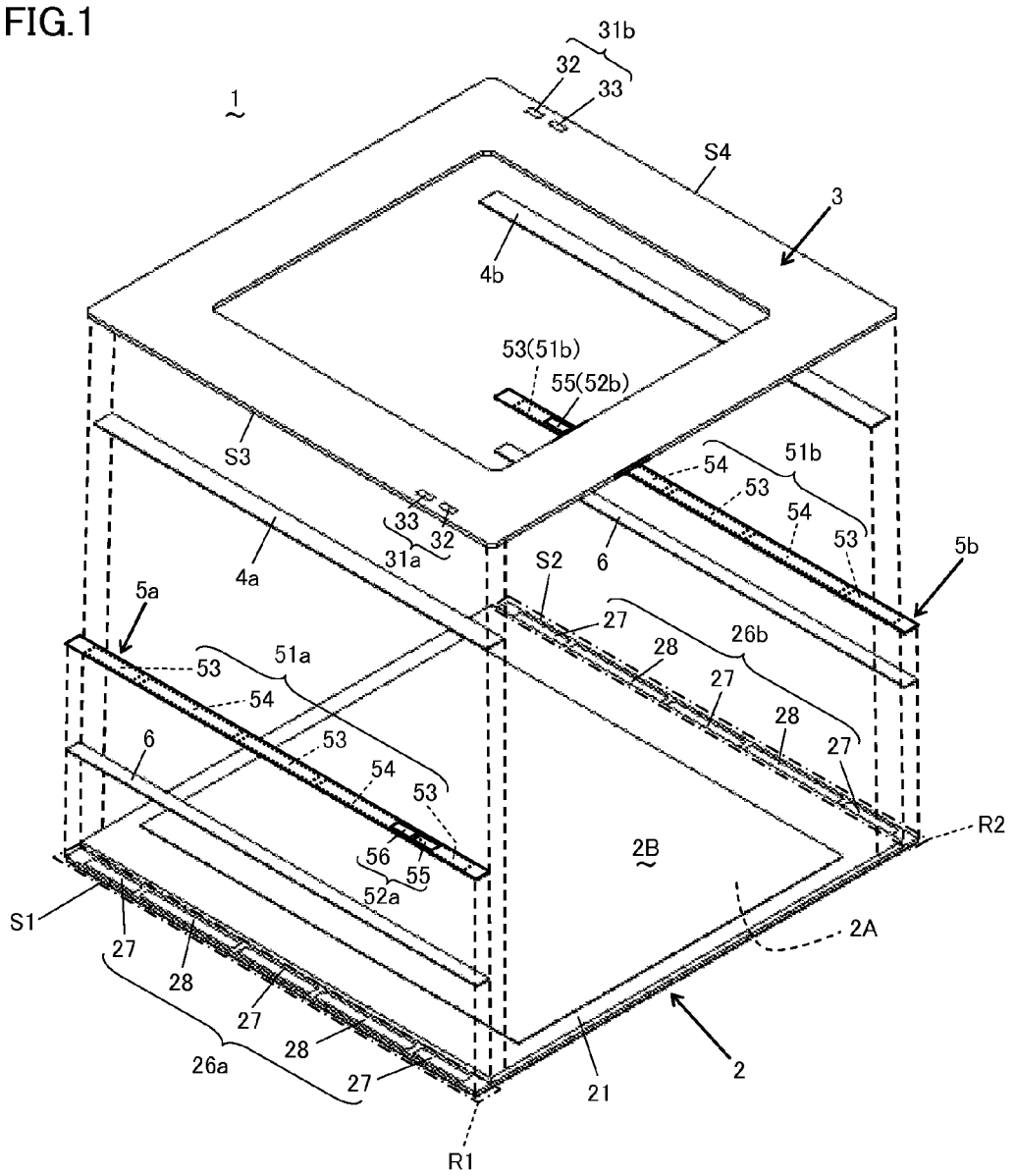
FIG. 1 is an exploded perspective view of a light emitting module according to an embodiment of the present invention.
Figure 2:
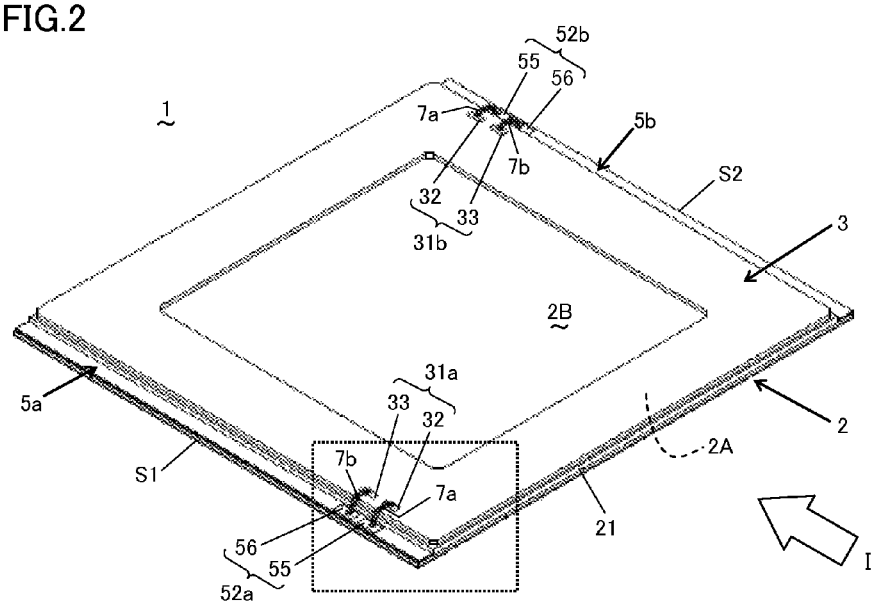
FIG. 2 is a perspective view of the light emitting module in FIG. 1.
Figure 3:
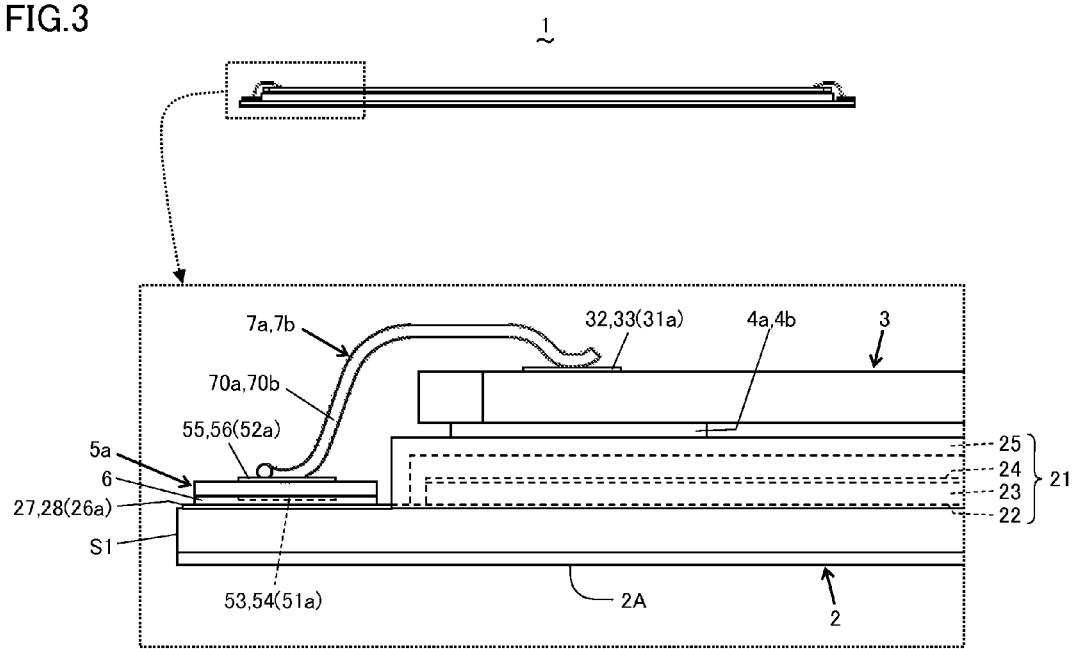
FIG. 3 is a side view of the light emitting module viewed from I direction of FIG. 2 and its partial enlarged view.

A light emitting module according to an embodiment of the present invention will be described with reference to FIGS. 1 to 5. As shown in FIGS. 1 to 3, a light emitting module 1 includes a light emitting panel 2 having a rectangular flat plate shape and a wiring board 3 which supplies power to the light emitting panel 2. The light emitting panel 2 has a light emitting surface 2A on one surface (a lower surface in the drawings) and has a non-light emitting surface 2B on a surface opposite to the light emitting surface 2A. The light emitting panel 2 has an organic EL device 21 as a light source. The organic EL device 21 has an anode 22 made up of ITO, an organic light emitting layer 23 laminated on the anode 22, a cathode 24 laminated on the organic light emitting layer 23, and a sealing case 25 which seals the anode 22, the organic light emitting layer 23, and the cathode 24 (refer to FIG. 3). The wiring board 3 has a rectangular flat plate shape with a hollow in its center and is mounted on the non-light emitting surface 2B of the light emitting panel 2 so that each side of the wiring board 3 is parallel to that of the light emitting panel 2.

The outer shape of the light emitting panel 2 is larger than that of the wiring board 3 and in the drawings, areas R1 and R2 (surrounded by chain lines in FIG. 1) where the wiring board 3 is not mounted are provided along mutually facing sides S1 and S2 of the light emitting panel 2. In these areas R1 and R2, electrode extraction units 26a and 26b used for supplying power to the organic EL device 21 are provided. The electrode extraction units 26a and 26b have anode extraction units 27 derived from the anode 22 of the organic EL device 21 and cathode extraction units 28 derived from the cathode 24 of the organic EL device 21. In the drawings, the three anode extraction units 27 and the two cathode extraction units 28 are alternately located along the sides S1 and S2.

The wiring board 3 has metal lands 31a and 31b used for an electrical connection to the outside on a surface opposite to a surface which is mounted on the light emitting panel 2. In the drawings, the metal land 31a is located to one side of the side S3 of the wiring board 3 corresponding to the side S1 of the light emitting panel 2, and the metal land 31b is located to the other side of the side S4 of the wiring board 3 corresponding to the side S2 of the light emitting panel 2. The wiring board 3 is adhered to the light emitting panel 2 just below the metal lands 31a and 31b and is adhered to the light emitting panel 2 by double-sided tapes 4a and 4b stuck along the sides S3 and S4 of the wiring board 3 in the drawings. The metal lands 31a and 31b have an anode land 32 used for an electrical connection to the anode extraction units 27 of the light emitting panel 2 and a cathode land 33 used for an electrical connection to the cathode extraction units 28 of the light emitting panel 2. The anode land 32 and the cathode land 33 are made up of a conductive metal and gold coating is applied on its surface.

The light emitting module 1 further includes auxiliary wiring boards 5a and 5b which electrically connect the light emitting panel 2 to the wiring board 3. The auxiliary wiring boards 5a and 5b have a long rectangular flat plate shape to occupy the areas R1 and R2 of the light emitting panel 2 and are arranged adjacent to the wiring board 3. The auxiliary wiring boards 5a and 5b have electrode pads 51a and 51b on a surface facing to the light emitting panel 2. The electrode pads 51a and 51b are electrically connected to the electrode extraction units 26a and 26b of the light emitting panel 2, and have three anode pads 53 facing to the anode extraction units 27 of the light emitting panel 2 and two cathode pads 54 facing to the cathode extraction units 28 of the light emitting panel 2. The anode pads 53 and the cathode pads 54 are electrically connected to the anode extraction units 27 and the cathode extraction units 28 by a conductive adhesive material 6, respectively. The adhesive material 6 is made up of, for example, silver paste or anisotropic conductive adhesive such as anisotropic conductive film and anisotropic conductive paste, and in the drawings, is made up of the anisotropic conductive film. Utilization of the anisotropic conductive film as the adhesive material 6 prevents short circuit between the anode pads 53 and the cathode pads 54 and enables efficient connection of the anode pads 53 and the cathode pads 54 to the anode extraction units 27 and the cathode extraction units 28.

The auxiliary wiring boards 5a and 5b further have metal pads 52a and 52b on a surface opposite to a surface where the electrode pads 51a and 51b are provided. The metal pads 52a and 52b have an anode metal pad 55 which is electrically connected to the anode pads 53 and a cathode metal pad 56 which is electrically connected to the cathode pads 54. The anode metal pad 55 and the cathode metal pad 56 are located in a position so that they are adjacent to the anode land 32 and the cathode land 33 of the wiring board 3 on a periphery of the light emitting module 1 when the auxiliary wiring boards 5a and 5b and the wiring board 3 are mounted on the light emitting panel 2.

The anode metal pad 55 and the cathode metal pad 56 are made up of a conductive metal which has gold-coated surface, and are wire-bonded to the anode land 32 and the cathode land 33 by conductive metal wires 7a and 7b (refer to FIGS. 2 and 3). Accordingly, the anode land 32 and the cathode land 33 are electrically connected to the anode extraction units 27 and the cathode extraction units 28 by the metal wires 7a and 7b, the anode metal pad 55 and the cathode metal pad 56, the anode pads 53 and the cathode pads 54, and the adhesive 6.

When the light emitting module 1 is viewed from its lateral side (I direction in FIG. 2), the height of the anode metal pad 55 and the cathode metal pad 56 is different from that of the anode land 32 and cathode land 33 (refer to FIG. 3). In the drawings, the anode metal pad 55 and the cathode metal pad 56 are located at a lower position (a position near to the anode 22 of the organic EL device 21), and the anode land 32 and the cathode land 33 are located at a higher position (a position farther from the anode 22). As a result, the metal wire 7a and 7b have a liberated part 70a and 70b which is liberated from the anode metal pad 55 and the cathode metal pad 56.

The metal wire 7a is made up of an aluminum wire, and it's both ends are joined to the anode metal pad 55 and the anode land 32 by ultrasonic joining at room temperature. The metal wire 7b is made up in the same manner with the metal wire 7a and is joined to the cathode metal pad 56 and the cathode land 33 by ultrasonic joining at room temperature. At this time, since the wiring board 3 is adhered to the light emitting panel 2 by the double-sided tapes 4a and 4b just below the anode land 32 and the cathode land 33, ultrasonic waves are reliably transmitted to the metal wires 7a and 7b, and the metal wires 7a and 7b can be efficiently connected to the anode land 32 and the cathode land 33.

Figure 4A:
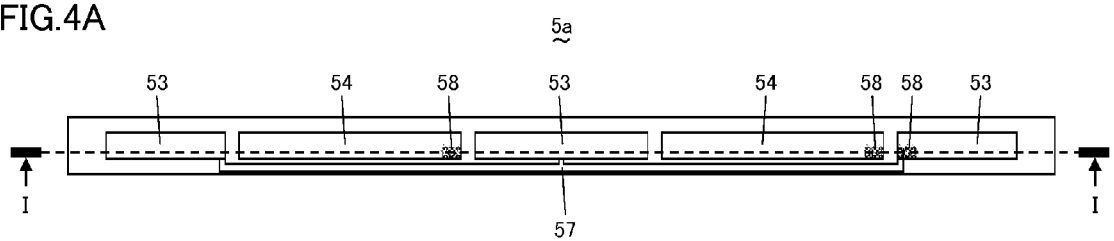
FIG. 4A is a plane view of an auxiliary wiring board, which constitutes the light emitting module in FIG. 1, viewed from an electrode pad side.
Figure 4B:
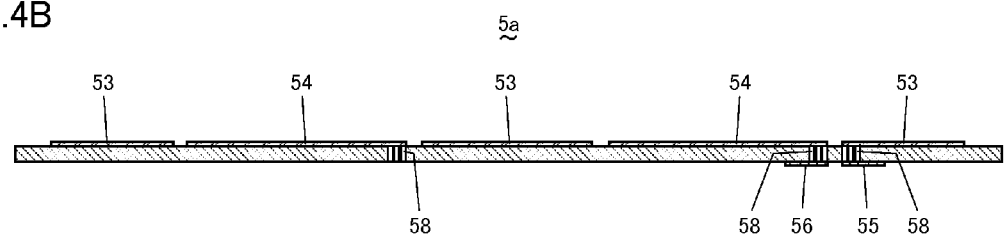
FIG. 4B is a sectional view taken along I-I line of FIG. 4A.
Figure 4C:
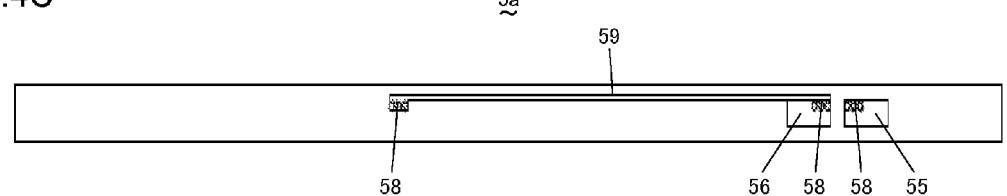
FIG. 4C is a plane view of the auxiliary wiring board of FIG. 4A viewed from a metal pad side.

As shown in FIGS. 4A to 4C, in the auxiliary wiring board 5a, the three anode pads 53 are electrically connected each other by a wiring pattern 57 provided on a surface where these anode pads 53 are located. The anode pad 53 located in a rightmost position in the drawings is electrically connected to the anode metal pad 55 by through-hole connection units 58 which go through the auxiliary wiring board 5a just below the anode pad 53. On the other hand, the two cathode pads 54 and the cathode metal pad 56 are electrically connected each other by the through hole connection units 58 provided just below the cathode pads 54 and a wiring pattern 59 provided on a surface where the cathode metal pad 56 is located. Although it is not shown in the drawings, the auxiliary wiring board 5b is also constituted in the same manner with the auxiliary wiring board 5a.

Figure 5A:
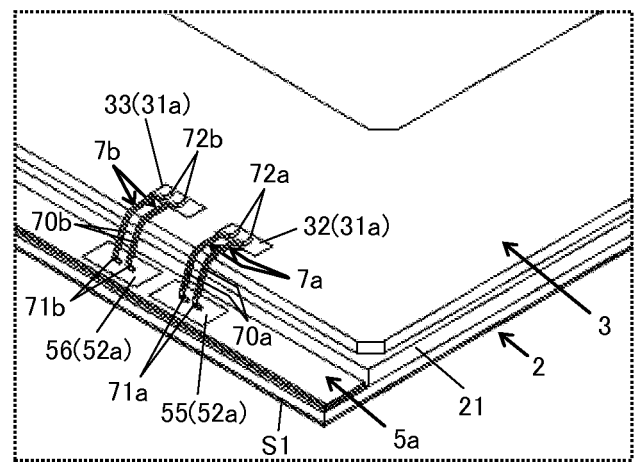
FIG. 5A is an enlarged view of an area surrounded by a dotted line of FIG. 2.
Figure 5B:
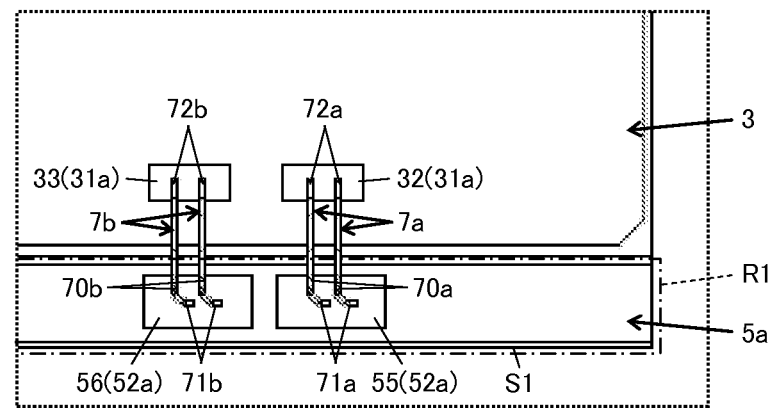
FIG. 5B is a plane view of FIG. 5A.
Figure 5C:
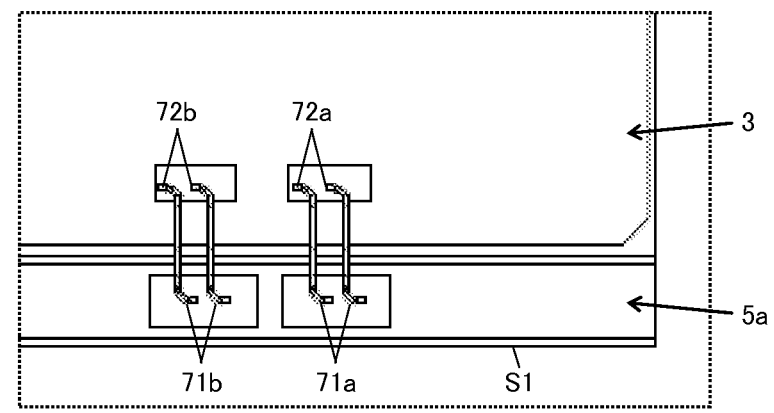
FIG. 5C is a plane view showing a modification example of FIG. 5B.

As shown in FIGS. 5A and 5B, ends 71a and 71b of the metal wires 7a and 7b joined to the metal pad 52a are arranged so as to extend in one direction along the side 51 of the light emitting panel 2. On the other hand, ends 72a and 72b of the metal wires 7a and 7b joined to the metal land 31a are arranged so as to extend in a direction different from that of the ends 71a and 71b, and in the drawings, are arranged so as to extend in a direction perpendicular to the side 51. Moreover, as shown in FIG. 5C, the ends 72a and 72b may also be arranged so as to extend in a direction opposite to that of the ends 71a and 71b along the side 51. The metal wires 7a and 7b joined to the metal pad 52b and the metal land 31b is also constituted in the same manner.

Such an arrangement of the metal wires 7a and 7b allows the metal wires 7a and 7b to efficiently absorb stress caused by a thermal expansion difference among the light emitting panel 2, the wiring board 3 and the auxiliary wiring board 5a when the light emitting panel 2, the wiring board 3 and the auxiliary wiring board 5a thermally-expand by heat generated according to light emission of the organic EL device 21. Moreover, since the height of the metal pad 52a is different from that of the metal land 31a and the metal wires 7a and 7b have the liberated part 70a and 70b, a flexure is easily generated in the metal wires 7a and 7b, and this flexure can also efficiently absorb the stress caused by the thermal expansion difference among the light emitting panel 2, the wiring board 3 and the auxiliary wiring board 5a. At this time, since the flexure of the metal wires 7a and 7b is formed to protrude toward the side direction of the light emitting panel 2, but not toward a thickness direction of the light emitting panel 2, thickness of the light emitting module 1 does not increase. In addition, since the ends 71a and 71b of the metal wires 7a and 7b are arranged so as to extend in one direction along the side S1 of the light emitting panel 2, it is possible to narrow the width of the auxiliary wiring board 5a in a short direction and thereby make the region R1 (non-light emitting region, refer to FIG. 5B) small.

According to the light emitting module 1, the metal pads 52a and 52b of the auxiliary wiring boards 5a and 5b which are electrically connected to the electrode extraction units 26a and 26b of the organic EL device 21 are wire-bonded to the metal lands 31a and 31b of the wiring board 3 by ultrasonic waves at room temperature. Since the wire-bonding by ultrasonic waves can be performed at lower temperature than the soldering metal wire connection, it is possible to suppress the thermal denaturation of the organic EL device 21. Moreover, since the ultrasonic wire-bonding is performed on the metal pads 52a and 52b of the auxiliary wiring boards 5a and 5b, the organic EL device 21 can be electrically connected to the wiring board 3 regardless of whether the electrode extraction units 26a and 26b are made up of the metal material or the non-metal material.

In addition, in the light emitting module 1, there are ten anode extraction units 27 and cathode extraction units 28 in total. Thus, for example, when the metal pads are provided on each of the anode extraction unit 27 and the cathode extraction unit 28, the ten metal pads need to be wire-bonded to the wiring board 3 and consequently production efficiency is reduced due to cumbersome wire-bonding process. Moreover, when the metal pad is made up of an expensive material such as MAM (molybdenum-aluminum-molybdenum), production cost gets higher. In contrast, in the light emitting module 1, since only four metal pads (the two anode metal pads 55 and the two cathode metal pads 56) are necessary in total, it is possible to reduce the wire-bonding process and thereby increase the production efficiency, and decrease production cost by reducing a total number of the necessary metal pads.

Figure 6:
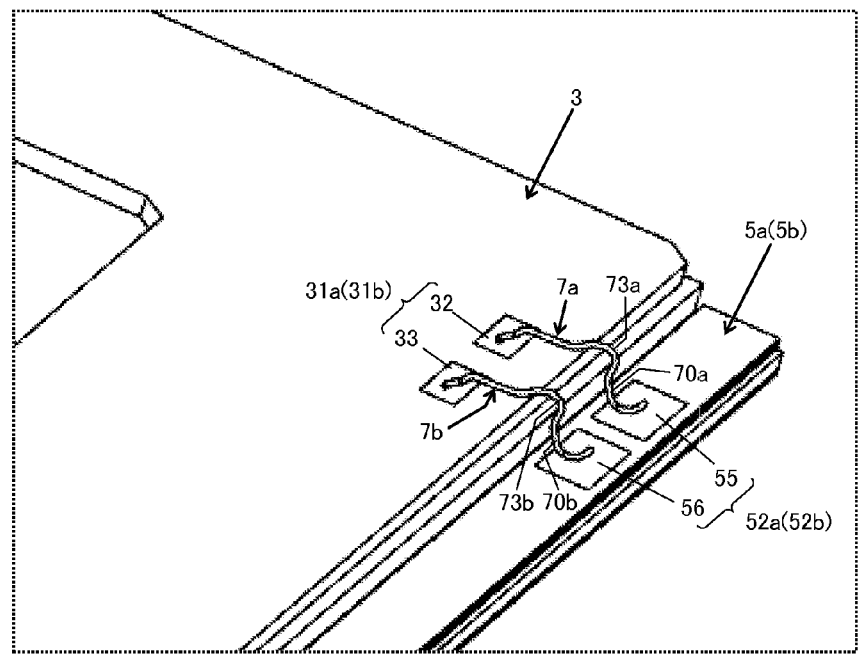
FIG. 6 is a perspective view of a light emitting module according to another embodiment of the present invention.

Next, a light emitting module according to another embodiment is described with reference to FIG. 6. In this light emitting module, the metal wires 7a and 7b have flexure parts 73a and 73b between their ends joined to the metal pad 52a (52b) and the metal land 31a (31b). These flexure parts 73a and 73b bend to protrude toward the side direction of the light emitting module. Providing such flexure parts 73a and 73b in addition to the liberated part 70a and 70b enables the metal wires 7a and 7b to efficiently absorb the stress caused by thermal expansion difference among the light emitting panel 2, the wiring board 3 and the auxiliary wiring board 5a (5b).

Figure 7:
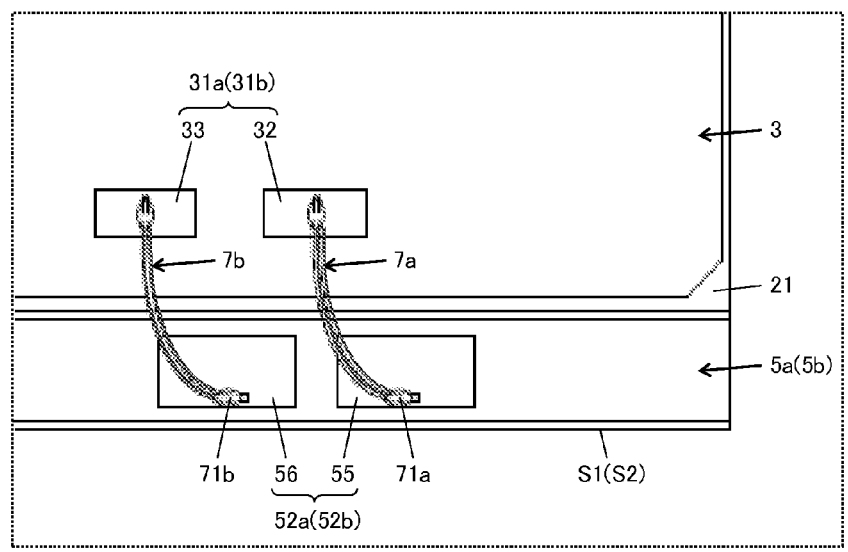
FIG. 7 is a plane view of a light emitting module according to still another embodiment of the present invention.

Next, a light emitting module according to still another embodiment is described with reference to FIG. 7. In this light emitting module, the ends 71a and 71b of the metal wires 7a and 7b joined to the metal pad 52a (52b) are arranged close to the side S1 (S2) (the lateral side of the light emitting module) on the metal pad 52a (52b). Consequently, the heat or vibration generated in ultrasonic joining of the metal wires 7a and 7b to the metal pad 52a is less likely to be transmitted to the organic EL device 21, so that the denaturation of the organic EL device 21 can be avoided more reliably. Moreover, in this light emitting module, the metal pad 52a (52b) and the metal land 31a (31b) are arranged with a position gap each other when the light emitting module is viewed from the wiring board 3 side. Accordingly, the flexure is easy to be generated on the metal wires 7a and 7b, enabling the metal wires 7a and 7b to absorb the stress caused by thermal expansion difference among the light emitting panel 2, the wiring board 3 and the auxiliary wiring board 5a (5b) more efficiently.

Figure 8A:
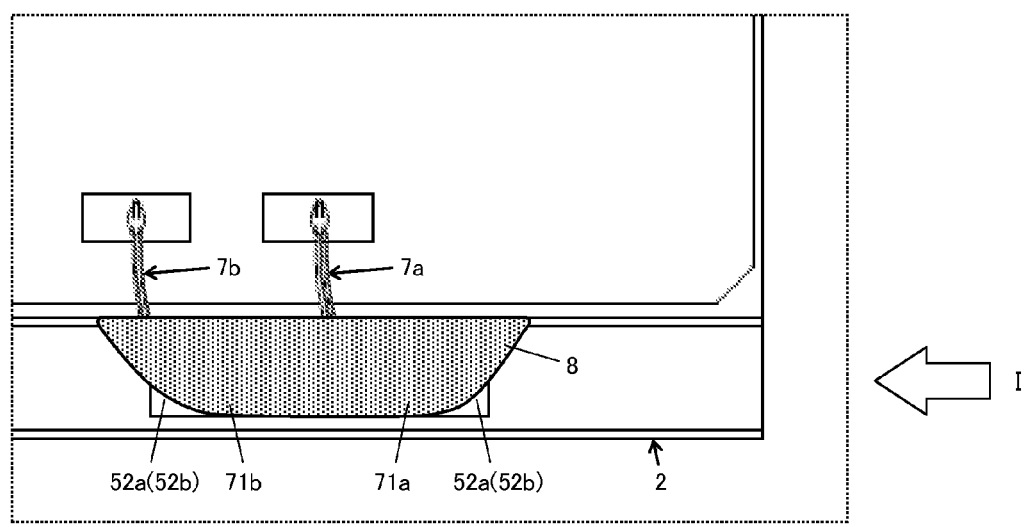
FIG. 8A is a plane view of a light emitting module according a modification example of the above embodiment.
Figure 8B:
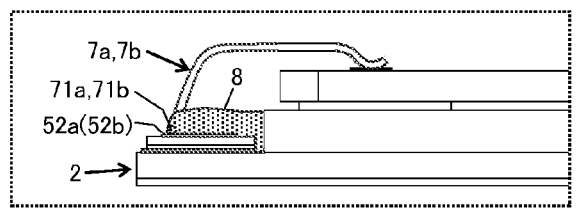
FIG. 8B is a side view of the light emitting module viewed from I direction of FIG. 8A.

Next, a light emitting module according to a modification example of the above embodiment is described with reference to FIGS. 8A and 8B. This light emitting module is based on the light emitting module shown in FIG. 7 and the ends 71a and 71b of the metal wires 7a and 7b are sealed by a sealing resin 8 injected into an inner side of the light emitting module relative to the ends 71a and 71b. Since the injected sealing resin 8 is blocked by the ends 71a and 71b, a leakage of the sealing resin 8 to the side of the light emitting panel 2 can be avoided.

The light emitting module according to the present invention is not limited to the above embodiment and its modification example and various modification may be applied. For example, the shape of the light emitting panel is not limited to the rectangular flat plate and can be a disk shape. Moreover, the metal wire is not limited to the aluminum wire and can be a gold wire or a copper wire, for example.

The invention claimed is:

1. A light emitting module, comprising:
a flat plate-shaped light emitting panel having a light emitting surface on one surface; and
a wiring board which is mounted on a non-light emitting surface located to an opposite side of the light emitting surface of the light emitting panel to supply power to the light emitting panel, wherein
the light emitting module further includes an auxiliary wiring board which electrically connects the light emitting panel to the wiring board,
the light emitting panel has an organic EL device as a light source, and electrode extraction units provided on the non-light emitting surface and derived from electrodes of the organic EL device,
the wiring board has a conductive metal land provided on a surface located opposite to a surface which is mounted on the light emitting panel,
the auxiliary wiring board has an electrode pad provided on a surface facing the light emitting panel and electrically connected to the electrode extraction units and a conductive metal pad provided on a surface located to an opposite side of the surface on which the electrode pad is located and electrically connected to the electrode pad, and
the metal pad is wire-bonded to the metal land by using a conductive metal wire, and both ends of the metal wire are joined to the metal pad and the metal land by ultrasonic joining.

2. The light emitting module according to claim 1, wherein
the metal pad is located to a periphery of the light emitting module,
ends of the metal wire joined to the metal pad is arranged so as to extend in one direction along a side of the light emitting panel, and
ends of the metal wire joined to the metal land is arranged so as to extend in a direction different from that of the ends of the metal wire joined to the metal pad.

3. The light emitting module according to claim 2, wherein the metal pad and the metal land are arranged with a position gap each other when the light emitting module is viewed from the wiring board side.

4. The light emitting module according to claim 1, wherein the electrode pad is electrically connected to the electrode extraction units by a conductive adhesive material.

5. The light emitting module according to claim 4, wherein the adhesive material is made up of an anisotropic conductive adhesive.

6. The light emitting module according to claim 1, wherein
the height of the metal pad is different from that of the metal land when the light emitting module is viewed from the side, and
the metal wire has a liberated part which is liberated from the metal pad.

7. The light emitting module according to claim 1, wherein
the metal wire has a flexure part which bends to protrude toward the side of the light emitting module between both ends joined to the metal pad and the metal land.

8. The light emitting module according to claim 1, wherein
the end of the metal wire joined to the metal pad is arranged close to the side of the light emitting module on the metal pad.

9. The light emitting module according to claim 1, wherein
the end of the metal wire joined to the metal pad is sealed by a sealing resin injected into an inner side of the light emitting module relative to the end.

10. The light emitting module according to claim 1, wherein
the metal wire is made up of an aluminum wire.

11. The light emitting module according to claim 1, wherein
gold coating is applied on a surface of the metal pad.

12. The light emitting module according to claim 1, wherein
the wiring board is adhered to the light emitting panel just below the metal land.

* * * * *